United States Patent
Cohen et al.

(10) Patent No.: US 10,601,429 B2
(45) Date of Patent: Mar. 24, 2020

(54) APPARATUS AND METHOD FOR BLUETOOTH SCAN

(71) Applicant: Apple Inc., Cupertino, CA (US)

(72) Inventors: Mik Cohen, Tel Aviv (IL); Shahar Meir, Raanana (IL); Yuval Avner, Haifa (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/031,602

(22) Filed: Jul. 10, 2018

(65) Prior Publication Data

US 2020/0021299 A1 Jan. 16, 2020

(51) Int. Cl.
| | |
|---|---|
| *H03L 7/091* | (2006.01) |
| *H04W 8/00* | (2009.01) |
| *H04W 4/80* | (2018.01) |
| *H03J 1/00* | (2006.01) |

(52) U.S. Cl.
CPC ............ *H03L 7/091* (2013.01); *H03J 1/0091* (2013.01); *H04W 4/80* (2018.02); *H04W 8/005* (2013.01)

(58) Field of Classification Search
CPC ....... H03L 7/091; H03J 1/0091; H04W 8/005; H04W 4/80
See application file for complete search history.

(56) References Cited

U.S. PATENT DOCUMENTS

| | | | | |
|---|---|---|---|---|
| 4,928,075 A | * | 5/1990 | Leis | H03L 7/107 327/552 |
| 8,315,244 B2 | * | 11/2012 | Nieto | H04W 56/00 370/350 |
| 9,553,565 B2 | * | 1/2017 | de Ruijter | H03J 7/04 |
| 9,641,651 B2 | * | 5/2017 | Kim | H04L 69/22 |
| 9,681,386 B2 | * | 6/2017 | Mujtaba | H04W 52/0238 |
| 10,206,173 B2 | * | 2/2019 | Mujtaba | H04W 52/0238 |
| 2013/0162466 A1 | * | 6/2013 | McDanell | H04B 7/18517 342/352 |
| 2016/0286545 A1 | * | 9/2016 | Luo | H04W 72/0413 |

* cited by examiner

*Primary Examiner* — Nader Bolourchi
(74) *Attorney, Agent, or Firm* — Sterne, Kessler, Goldstein & Fox P.L.L.C.

(57) ABSTRACT

Methods and systems for substantially simultaneously scan of two or more frequencies using one transceiver are discussed herein. For example, a listening device can include a controller configured to control its transceiver to alternate between two or more frequencies from two or more sets of frequencies. The controller is also configured to capture a portion of a preamble of a received signal to determine whether the received signal is intended for the listening device.

20 Claims, 11 Drawing Sheets

APPARATUS AND METHOD FOR BLUETOOTH SCAN

BACKGROUND

Field

This disclosure generally relates to techniques for implementing a scan mechanism for Bluetooth™ devices.

Related Art

Bluetooth™ devices can use paging and scanning to establish connections. A listening Bluetooth™ device is configured to scan different channels to determine whether any of the channels include packets addressed to the listening Bluetooth™ device. A tradeoff exists between how fast the listening Bluetooth™ device can connect to another Bluetooth™ device and the battery life of the listening Bluetooth™ device. For example, for the listening device to connect faster to the other device, the listening device scans the channels more often and therefore more battery of the listening device is used. On the other hand, to preserve the battery, the listening device can scan the channels less often, which can result in added delay in connecting to the transmitting device.

SUMMARY

The described embodiments relate to methods and systems for substantially simultaneously scanning two or more frequencies using one transceiver. For example, a listening device can include a controller configured to control the transceiver of the listening device to alternate between two or more frequencies from two or more sets of frequencies. The controller is also configured to capture part of a preamble of a received signal to determine whether the received signal is intended for the listening device.

Some embodiments relate to a method including configuring a transceiver of a device to operate at a first frequency of a first set of frequencies. The method further includes receiving a signal from the transceiver and capturing a portion of a preamble from the signal. The method also includes determining, based at least in part on the captured portion of the preamble and before capturing a remainder of the preamble, whether the received signal is intended for the device. In response to determining that the received signal is not intended for the device, configuring the transceiver of the device to operate at a second frequency of a second set of frequencies. However, in response to determining that the received signal is intended for the device, the method includes permitting the transceiver of the device to continue operation at the first frequency of the first set of frequencies and capturing the preamble and a payload of the received signal.

Some embodiments relate to a method including periodically switching between a first frequency of a first set of frequencies and a second frequency of a second set of frequencies at which a transceiver of a first device operates. The method further includes capturing a portion of a preamble from a signal received from a second device and determining, based at least in part on the captured portion of the preamble and before capturing a remaining portion of the preamble, whether the received signal is intended for the device. In response to determining that the received signal is not intended for the first device, the method includes continuing the periodical switching between the first frequency and the second frequency. In response to determining that the received signal is intended for the first device, the method includes ceasing the periodic switching between the first and second set of frequencies and capturing the remaining portion of the preamble and a payload from the received signal. The method further includes establishing a connection between the first device and the second device.

Some embodiments relate to a device. The device includes a memory and a processor, communicatively coupled to the memory. The processor is configured to configure a transceiver of the device to operate at a first frequency of a first set of frequencies, receive a signal from the transceiver, and capture a portion of a preamble of the signal. The processor is further configured to determine, based at least in part on the captured portion of the preamble and before capturing a remainder of the preamble, whether the received signal is intended for the device. In response to determining that the received signal is not intended for the device, the processor is configured to configure the transceiver of the device to operate at a second frequency of a second set of frequencies. In response to determining that the received signal is intended for the device, the processor is configured to permit the transceiver of the device to continue operation at the first frequency of the first set of frequencies and capture the preamble and a payload of the received signal.

Some embodiments relate to a system. The system includes a transceiver comprising a phase lock loop (PLL) and a controller communicatively coupled to the transceiver. The controller is configured to configure the PLL of the transceiver to operate at a first frequency of a first set of frequencies and capture a portion of a preamble from the signal received from the transceiver. The controller is further configured to determine, based at least in part on the captured portion of the preamble and before capturing a remainder of the preamble, whether the received signal is intended for the system. In response to determining that the received signal is not intended for the device, the controller is configured to configure the PLL to operate at a second frequency of a second set of frequencies.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE FIGURES

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1A:
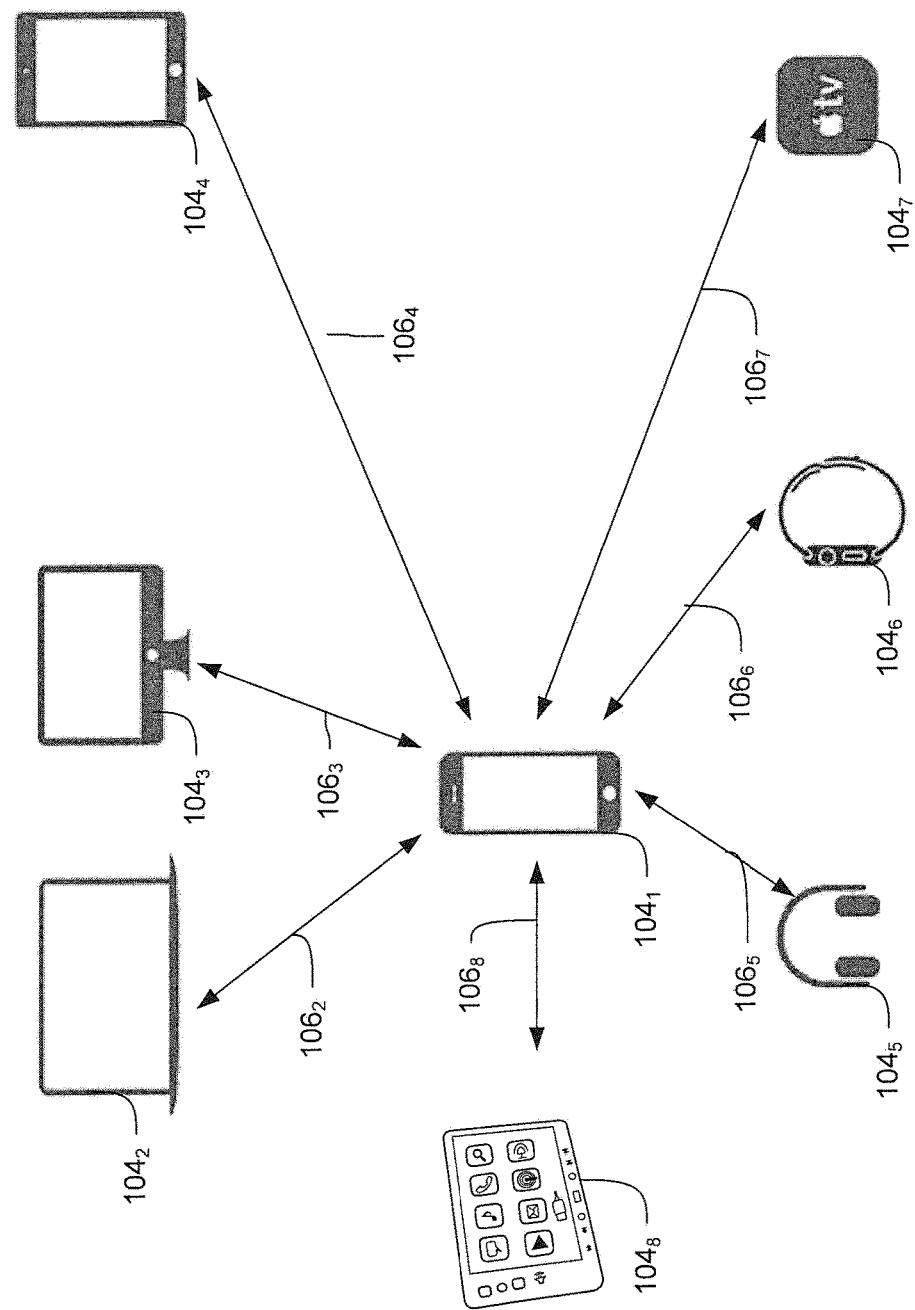
FIG. 1A is a functional block diagram depicting an example device in an environment with a plurality of devices, according to some embodiments.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

FIG. 1A is a functional block diagram depicting an example of an environment 100 with a plurality of devices $104_1$-$104_8$ (also generically referred to herein as device 104), according to some embodiments. FIG. 1A shows that device $104_1$ can be connected to one or more other devices $104_{2-8}$ via connections $106_{2-8}$. The device $104_1$ may be a device from a wide assortment of different devices. For instance, the device $104_1$ may be selected from any/all of laptop computers, desktop computers, smart phones, tablet computers, wearable devices (such as an Apple Watch™), human interface devices, speaker devices, headphone devices, multimedia devices (such as an Apple TV™), mobile multimedia devices (e.g. a head unit), etc. Similar to the device $104_1$, the devices $104_{2-7}$ can be selected from a wide assortment of different devices, such as the devices listed above. It is to be appreciated that environment 100 may include other devices in addition to or in place of the devices illustrated in FIG. 1A without departing from the scope and spirit of this disclosure.

The connections $106_{2-8}$ are illustrated in FIG. 1A as possible connections between the device $104_1$ and the devices $104_{2-8}$. Based on the disclosure herein, a person of ordinary skill in art will understand that each of the devices $104_{1-8}$ can form one or more connections with other devices $104_{1-8}$. As one example, the device $104_1$ can form a connection with either or both of the devices $104_2$ and $104_3$. One or all of the connections $106_{2-8}$ (and other connections between other devices $104_{1-8}$) may be wireless and may include, but are not limited to, a cellular network connection (such as but not limited to Universal Mobile Telecommunications System (UMTS) or with the Long-Term Evolution (LTE)), a wireless local network connection (such as but not limited to Institute of Electrical and Electronics Engineers (IEEE) 802.11 standard, which is sometimes referred to as Wi-Fi, or based on Bluetooth™ or Bluetooth™ Low Energy from the Bluetooth Special Interest Group of Kirkland, Wash.), or any other wireless connections using standardized and/or proprietary protocols. In some embodiments, one, multiple, or all of connections $106_{2-8}$ may be implemented as wired connections between each of the respective devices.

As a non-limiting example, the device $104_1$ may establish a wireless connection $106_8$ with the device $104_8$. The wireless connection $106_8$ may be a connection based on any of the Bluetooth™ protocol, a Bluetooth™ Low Energy protocol, or a Bluetooth™ Low Energy Long Range protocol. To establish the wireless connection $106_8$ for the first time, the devices $104_1$ and $104_8$ may perform a pairing operation. The pairing operation may include an inquiry and/or a paging from a master (or "primary") device (e.g., the device $104_8$) and scanning from a slave (or "secondary") device (e.g., the device $104_1$.) For example, if the device $104_8$ does not know an identifier (e.g., an address) of the device $104_1$, the device $104_8$ may transmit an inquiry message such that a slave device (e.g., the device $104_1$) may respond with its identifier. Additionally or alternatively, the device $104_8$ may transmit a page message with the identifier of the device $104_1$. The device $104_8$ can transmit the page message over different frequencies. The device $104_1$ scans the different frequencies and can detect the page message. When the device $104_1$ detects a page message destined for the device $104_1$, the device $104_1$ may establish the connection $106_8$ with the device $104_8$.

Figure 1B:
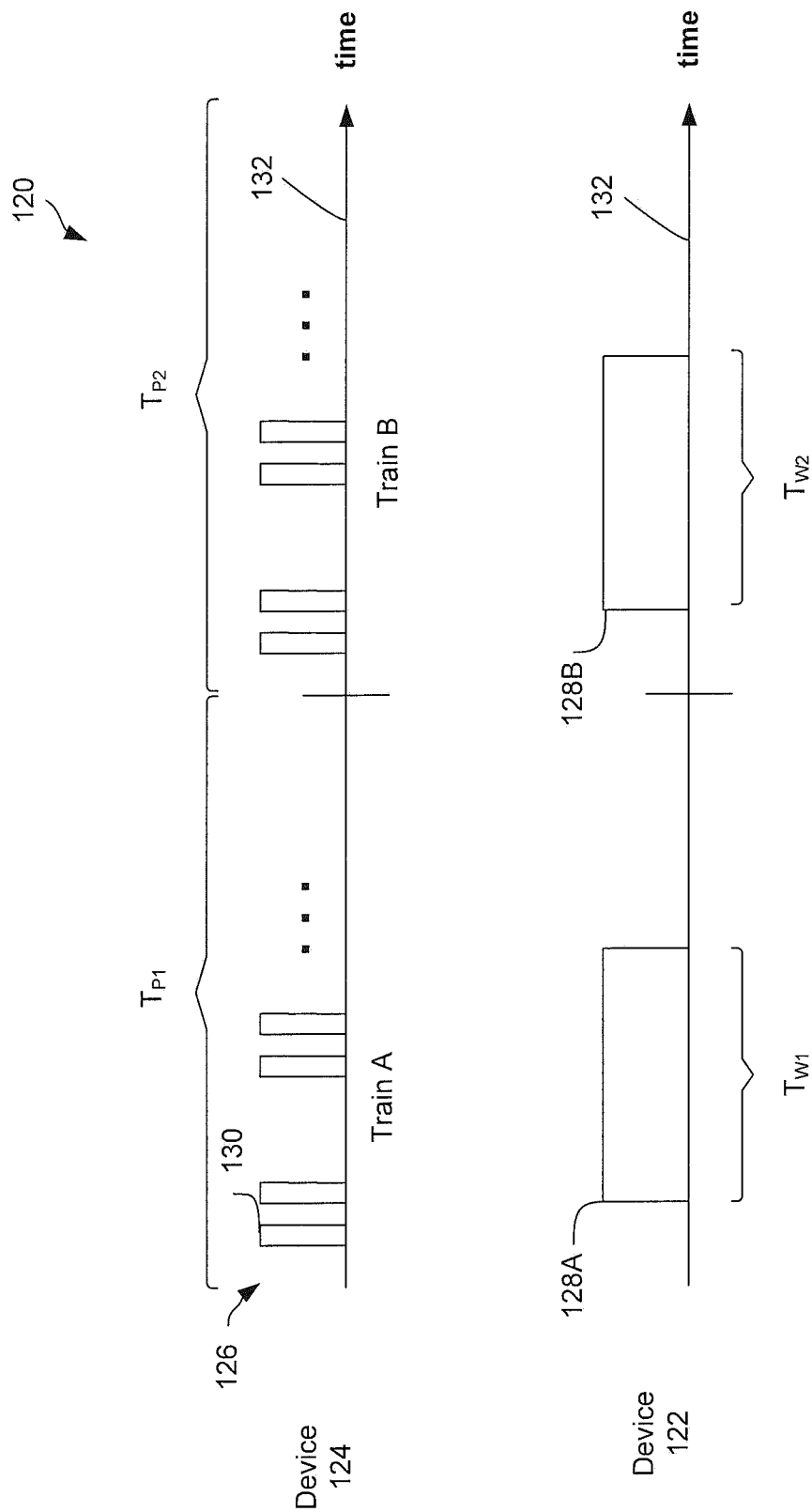
FIG. 1B is a diagram depicting an example communication between two devices, according to some embodiments.

FIG. 1B is a diagram 120 depicting an example communication by a device 124 (e.g., device $104_8$ from FIG. 1A) to a device 122 (e.g., device $104_1$ from FIG. 1A) when the devices attempt to establish a communication connection with one another, according to some embodiments. The example signals in diagram 120 are plotted against a time axis 132. As shown in FIG. 1B, the device 124 may transmit a series of signal trains 126, in which each signal train includes one or more pages 130. The example of FIG. 1A depicts the signal trains 126 as Train A and Train B, but more or fewer trains could be used in accordance with the scope and spirit of this disclosure. In some embodiments, the signal trains 126 may be implemented as Bluetooth™ pages, Bluetooth™ Low Energy pages, and/or a Bluetooth™ Low Energy Long Range pages. Each of the trains has a particular duration. For instance, as shown in the example of FIG. 1B, Train A has a duration of $T_{P1}$ and Train B has a duration of $T_{P2}$. The respective durations of the trains, e.g., Train A and Train B, can be the same or can differ. Furthermore, the trains, e.g., Train A and Train B, may be transmitted on the same channel or on different channels.

The device 122 may periodically open a page scan window 128 such as, for example, page scan windows 128A and 128B shown in FIG. 1B. The page scan window 128A may roughly correspond to Train A transmitted by the device 124. Similarly, the page scan window 128B may roughly correspond to Train B transmitted by the device 124. Each of the page scan windows 128A and 128B may also have a corresponding duration (or period). For instance, the page scan window 128A can have a duration $T_{W1}$ and the page scan window 128B can have a duration $T_{W2}$. It should be noted, that FIG. 1B is merely for illustrative purposes and no attempt has been made to depict the windows 128 of the device 122 and the transmissions of the device 124 to either a relative or absolute scale.

In some embodiments, the device 122 detects, during the page scan window 128, one or more of the pages 130 associated with one of the trains 126 transmitted by the device 124. Once the device 122 detects a page 130 transmitted by the device 124, the procedure for establishing a connection can be followed, and the device 124 and the device 122 form a connection—e.g., the connection $106_8$ from FIG. 1A.

In some examples, the frequencies on which the device 124 transmits the page message can include a plurality of sets of frequencies. For example, for a connection establishment according to the Bluetooth™ protocol, the frequencies on which the device 122 transmits the page message can include two sets of frequencies, each set including, e.g., 16 different frequencies. The device 124 transmits the pages over the first set of frequencies for a period of time using, for example, Train A that has a duration of $T_{P1}$. If the device 122 receives no response (for example from the device 124), the device 122 transmits the pages over the second set of frequencies using, for example, Train B that has a duration of $T_{P2}$. In this example, the device 122 opens the page scan window 128A to scan for frequencies associated with the first set of frequencies. The device 122 opens the page scan window 128B to scan for frequencies associated with the second set of frequencies.

In some examples, at least a third set of frequencies can be assigned for connection establishment according to the Bluetooth™ Low Energy protocol and/or at least a fourth set of frequencies can be assigned for connection establishment according to the Bluetooth™ Low Energy Long Range protocol.

According to some examples, when the devices 122 and 124 would like to connect again after the initial connection and pairing, the device 122 can use a specific frequency in each of the plurality of sets of frequencies to scan the channel associated with that specific frequency. This specific frequency can be based on the frequency used during initial pairing. In conventional methods, a slave device would scan a channel using a frequency from a first set of frequencies for a first period of time. If the slave device does not find any paging message addressed to the slave device, the slave device would scan a channel using a frequency from a second set of frequencies for a second period of time. If the slave device does not find any pages addressed to the slave device, the slave device would scan a channel using a frequency from a third set of frequencies for a third period of time. The slave device can perform this operation for all the plurality of the sets of frequencies.

Since page scanning can consume a significant amount of power, it can be advantageous to reduce the size of the page scan windows 128. For example, using shorter page scan windows 128 can reduce power consumption, thereby prolonging battery life. However, when the page scan window is too small, the page scan window 128 may not align with pages 130 transmitted by the device 124. Consequently, several page scan windows 128 may be needed for the device 122 to detect one or more pages 130 transmitted by the device 124. This can delay connection establishment between the device 124 and the device 122.

In some of the embodiments of this disclosure, the device 122 is configured to substantially simultaneously scan two or more frequencies using only one transceiver. For example, the device 122 substantially simultaneously scans a channel associated with a frequency from a first set of frequencies and a channel associated with a frequency from a second set of frequencies. However, in other embodiments, any combination of frequencies can be scanned. In one example regarding the initial connection and pairing between the devices 122 and 124, during the page scan window 128A, the device 122 may substantially simultaneously scan a first frequency of a first set of frequencies (for example the first set associated with Train A transmitted by the device 124) and a second frequency for a second set of frequencies (for example the second set associated with Train B transmitted by the device 124.) In other words, the device 122 can scan with respect to two sets of frequencies (associated with Train A and Train B) during page scan window 128A. Accordingly, a connection can be established more quickly and battery/power consumption associated with scanning and paging can be reduced. However, it is noted that the embodiments of this disclosure are not limited to the initial connection and pairing. The embodiments of this disclosure are also applied when devices, e.g., the devices 122 and 124, would like to connect again after the initial connection and pairing.

In some examples, the first set of frequencies and the second set of frequencies are associated with connection establishment according to the Bluetooth™ protocol. In other examples, the first set of frequencies is associated with connection establishment according to the Bluetooth™ protocol and the second set of frequencies is associated with connection establishment according to the Bluetooth™ Low Energy protocol. In further examples, the first set of frequencies is associated with connection establishment according to the Bluetooth™ protocol and the second set of frequencies is associated with connection establishment according to the Bluetooth™ Low Energy Long Range protocol. In yet other examples, the first set of frequencies is associated with connection establishment according to the Bluetooth™ Low Energy protocol and the second set of frequencies is associated with connection establishment according to the Bluetooth™ Low Energy Long Range protocol. It is noted that these sets of frequencies and their combinations are provided as examples and they do not limit the embodiments of this disclosure. Based on the disclosure herein, a person of ordinary skill in the art will understand that other sets and other combinations can exist.

Figure 2:
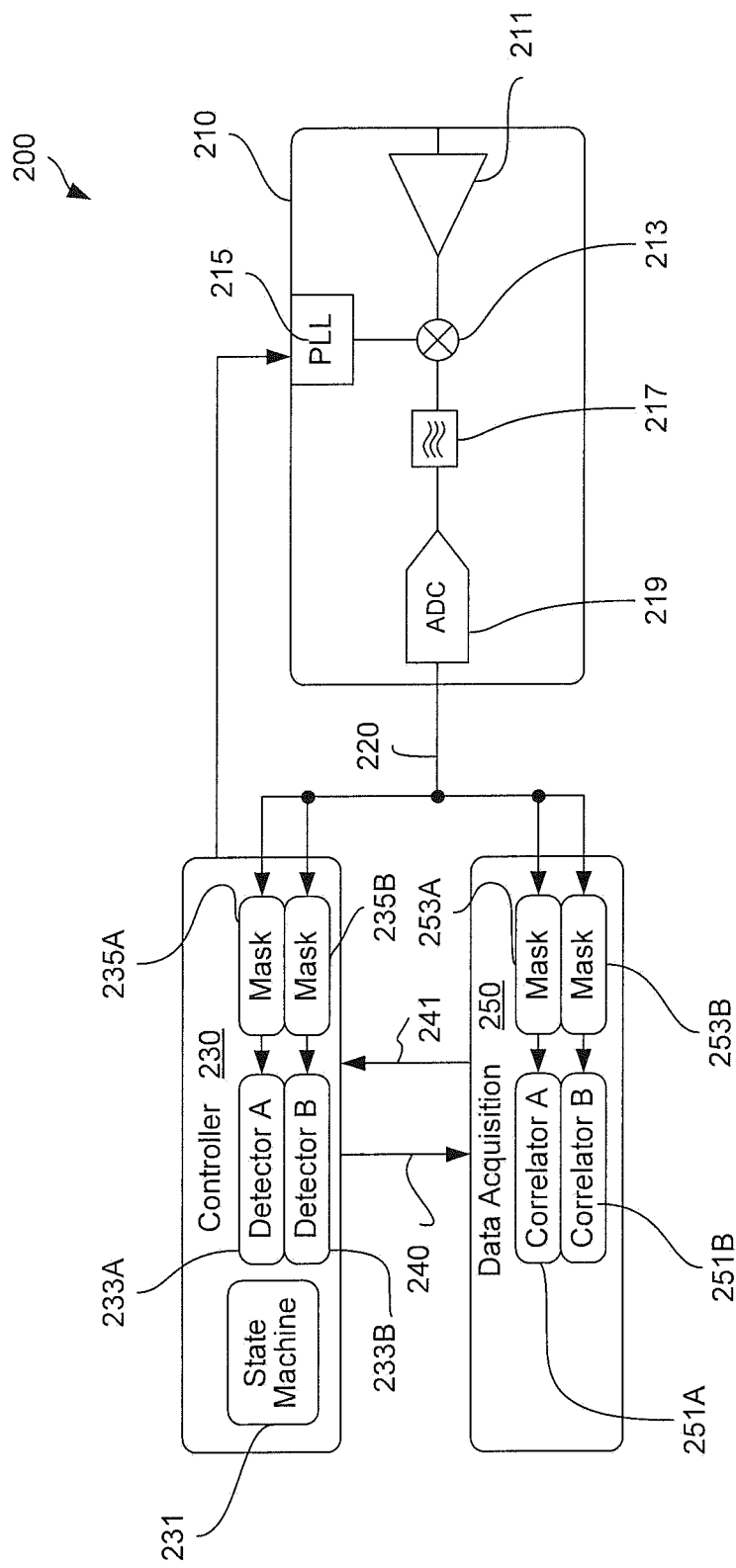
FIG. 2 is a functional block diagram depicting an example system implementing a scan method, according to some embodiments of the disclosure.

FIG. 2 is a functional block diagram depicting an example system implementing a scan method, according to some embodiments of the disclosure. System 200 of FIG. 2 can be implemented within one or more devices of FIG. 1A.

System 200 includes a transceiver 210, a controller 230, and a data acquisition circuitry 250. It is noted that the transceiver 210, the controller 230, and the data acquisition circuitry 250 are depicted as exemplary components of the system 200, and the system 200 can include other components.

As illustrated in the example of FIG. 2, the transceiver 210 includes an amplifier 211, a mixer 213, a phase-locked loop (PLL) 215, a filter 217, and a converter 219, according to some embodiments. In some examples, the amplifier 211 can include, but is not limited to, a low noise amplifier (LNA). The converter 219 can also include, but is not limited to, an analog to digital converter. According to some embodiments, the transceiver 210 may be configured to receive an input signal using, for example, an antenna that is communicatively coupled to the amplifier 211. The received input signal is amplified by the amplifier 211. The amplified signal is then mixed, using the mixer 213, with a signal from PLL 215. The input signal can include one or more pages from, for example, device $104_8$.

According to some embodiments, and as discussed in more detail below, the PLL 215 can be controlled by the controller 230 such that the output signal of the PLL 215 includes a selected frequency and/or a selected frequency band. The amplified received input signal (e.g., an amplified radio frequency (RF) signal) and the output signal of the PLL 215 are input to the mixer 213. According to some embodiments, the mixer 213, using the output signal of the PLL 215, is configured to downconvert the amplified received input signal. Therefore, the output of the mixer 213 includes a baseband signal or an intermediate frequency (IF) signal determined based on the frequency of the output signal from the PLL, according to some embodiments. According to some examples, the PLL 215 can include a fast-lock PLL. For example, the PLL 215 can have approximately a 1 μsec lock time with +/−100 KHz. The mixed signal output of the mixer 213 can pass through the filter 217. The filter 217 can include a low pass filter, a bandpass filter, and/or other filters. The filtered signal can be converted from analog to digital using the converter 219 to generate the digital signal 220. The digital signal 220 then is fed to the controller 230 and the data acquisition circuitry 250. It is noted that the components of the transceiver 210 discussed above are exemplary circuits and/or modules and the transceiver 210 can include fewer, different, or additional circuits/modules.

The controller 230 can be communicatively coupled to the transceiver 210. For example, the controller 230 can control PLL 215 of the transceiver 210. Additionally, the controller 230 can receive the signal 220 from the transceiver 210. According to some embodiments, the controller 230 can include a state machine 231 and one or more detectors 233A and 233B (collectively referred to as detector 233). Optionally, the controller 230 can include one or more digital muting masks 235A and 235B (collectively referred to as digital muting mask 235.) It is noted that the depicted components of the controller 230 are exemplary circuits and/or modules, and the controller 230 can include fewer, different, or additional circuits/modules.

According to some embodiments, the controller 230 controls the PLL 215 of the transceiver 210. For example, the controller 230 controls the frequency (and/or frequency band) at which the PLL 215 is locked. Controller 230, using for example the state machine 231, controls the PLL 215 to alternate between a first frequency ($f_1$) and a second frequency ($f_2$). Additionally, the controller 230, using for example the state machine 231, controls the PLL 215 to stop alternating between the first frequency and the second frequency such that the PLL 215 operates at a selected one of the first frequency or second frequency.

According to some embodiments, the detector 233 detects at least a portion (e.g., a beginning or a part of the beginning) of a preamble from the signal 220 and determines whether the detected portion of the preamble corresponds to a desired signal. In some examples, the captured portion of the preamble used in the determination is part of the preamble, not the whole preamble from the signal 220. In these examples, the detector 233 is configured to determine whether the detected portion of the preamble corresponds to the desired signal before receiving and/or capturing the remainder of the preamble and/or before receiving and/or capturing the remainder of a message associated with the preamble. Although some of the embodiments of this disclosure are discussed with respect to the beginning or a part of the beginning of the preamble, the embodiments of this disclosure are not limited to these examples and any portion of the preamble from signal 220 (e.g., the beginning, part of the beginning, or beyond) can be detected and used by the detector 233, without capturing the remainder or all of the preamble.

According to some embodiments, a desired signal includes a signal that is destined to the device that includes the system 200. For example, the desired signal can include an identifier (ID) (e.g., an address) associated with the device. If the detector 233 determines that the detected beginning or part of the beginning of the preamble corresponds to the desired signal (e.g., the received input signal includes an identifier of the device that includes the system 200), the controller 230 (using for example the state machine 231) can control PLL 215 to stop alternating between the first frequency and the second frequency. Further, the controller 230 informs the data acquisition circuitry 250 that the detected beginning or part of the beginning of the preamble appears to correspond to the desired signal and instructs the data acquisition circuitry 250 to detect the preamble of the signal 220. Since controller 230 operates on at least part of the beginning of the preamble (e.g., beginning or part of the beginning of the preamble), determining whether the received input signal includes the identifier associated with device using the detected at least part of the beginning of the preamble may result in incorrect detections in some cases. Therefore, the data acquisition circuitry 250 can further perform the determination whether the received input signal includes the identifier associated with device using the detected preamble at the data acquisition circuitry 250, according to some embodiments.

An exemplary operation of the system 200 is discussed in more detail below. It is noted that this discussion is an exemplary operation and the embodiments of this disclosure are not limited to this example. In this example, the PLL 215 operates at the first frequency. Digital signal 220, which is output from the transceiver 210, is input to the controller 230. According to some examples, the signal 220 is input to the digital muting masks 235A and 235B. Digital muting mask 235 can mask the received signal having a frequency different than the selected frequency of the digital muting mask. For example, the digital muting mask 235A is designed for the first frequency and the digital muting mask 235B is designed for the second frequency. In some embodiments, the digital muting masks 235A and 235B are respective digital notch filters having respective passbands tuned the respective first and second frequencies. In some embodiments, any number of digital muting masks can be included. Signal 220 that is generated from the input signal when the PLL 215 operates at the first frequency will be masked by digital muting mask 235B so that the detector 233B (which is designed for the second frequency) does not make any detection. However, the digital muting mask 235A passes the signal 220 that is generated from the input signal when the PLL 215 operates at the first frequency to the detector 233A. According to some embodiments, the detector 233A detects a beginning or a part of the beginning of a preamble of signal 220 and determines whether the detected beginning or part of the beginning of the preamble corresponds to a desired signal. If the detector 233A determines that the detected beginning or part of the beginning of the preamble does not correspond to the desired signal, the controller 230 (using for example the state machine 231) controls the PLL 215 to switch to the second frequency.

Continuing with this example, the PLL 215 operates at the second frequency. Digital signal 220, which is the output from the transceiver 210, is input to the controller 231. According to some examples, the signal 220 is input to the digital muting masks 235A and 235B. Signal 220 that is generated from the input signal when the PLL 215 operates at the second frequency will be masked by the digital muting mask 235A so that the detector 233A (which is designed for the first frequency) does not make any detection. However, the digital muting mask 235B passes the signal 220 that is generated from the input signal when the PLL 215 operates at the second frequency to the detector 233B. According to some embodiments, the detector 233B detects a portion (e.g., a beginning or a part of the beginning) of a preamble of the signal 220 and determines whether the detected portion of the preamble corresponds to a desired signal. If the detector 233B determines that the detected beginning or part of the beginning of the preamble does not correspond to the desired signal, the controller 230 (using for example the state machine 231) controls the PLL 215 to switch to the first frequency.

In some embodiments, this process can continue until, for example, one of the detectors determines that the detected beginning or part of the beginning of the preamble corresponds to the desired signal. As one example, the detector 233A, before capturing the remainder portion of the preamble, determines that the detected beginning or part of the beginning of the preamble of the signal 220 corresponds to the desired signal. In this case, the controller 230 (using for example the state machine 231) controls the PLL 215 to stop alternating between the first frequency and the second frequency, and uses the first frequency. Then, the controller 230 informs the data acquisition circuitry 250 that the detected beginning or part of the beginning of the preamble corresponds to the desired signal and instructs the data acquisition circuitry 250 to detect the preamble of the signal 220.

According to some embodiments, the data acquisition circuitry 250 can include one or more correlators 251A and 251B (collectively referred to as correlators 251.) Data acquisition circuitry 250 can optionally include one or more digital muting masks 253A and 253B (collectively referred to as digital muting masks 253). Upon receiving the instructions 240 from the controller 230, the data acquisition circuitry 250 can detect the remainder portion of the preamble from signal 220. Continuing with the example above, the controller 230 informs the data acquisition circuitry 250 that the detected beginning or part of the beginning of the preamble appears to correspond to the desired signal. Controller 230 can use the signal 240 to communicate with the data acquisition circuitry 250. Controller 230 can also instruct the data acquisition circuitry 250 that the desired signal is associated with the first frequency (in this example.) Based on the received signal 240, the data acquisition circuitry 250 uses the correlator 251A (which is associated with the first frequency) to detect and capture the remainder portion of the preamble or part of the preamble from signal 220. Digital muting mask 253 operates in a similar manner to digital muting mask 235 of controller 230 discussed above.

The data acquisition circuitry 250 using the correlator 251 compares the captured remainder portion of the preamble with the desired signal. If the data acquisition circuitry 250 and the correlator 251 determine that the captured remainder portion of the preamble does not correspond to the desired signal, the data acquisition circuitry 250 can infoun the controller 230 that the received signal does not correspond to the desired signal. The data acquisition circuitry 250 can use signal 241 to communicate with the controller 230, according to some embodiments. In response, the controller 230 can instruct the state machine 231 to switch to the next frequency. This process can continue until, for example, one of the detectors 233 of the controller 230 determines that a detected beginning or part of the beginning of the preamble corresponds to the desired signal. If the data acquisition circuitry 250 and the correlator 251 determine that the captured remainder portion of the preamble corresponds to the desired signal, the data acquisition circuitry 250, using the correlator 251, can capture the rest of the received signal (e.g., the payload associated with the received signal) and use the data and information within the preamble and the payload for establishing a connection with the second device.

According to some examples, system 200 can substantially simultaneously scan two frequencies ($f_1$ and $f_2$) using one transceiver 210, e.g., based on the procedure discussed above. It is noted that although two frequencies are illustrated and are discussed with respect to FIG. 2, the embodiments of this disclosure can be extended to three or more frequencies scanned using one receiver.

According to some examples, detector 233 can include correlators configured to correlate an input signal to a reference signal. In some embodiments, the detector 233 can include IQ correlators, where I is the in-phase component of a waveform and Q is the quadrature component of the waveform. Additionally or alternatively, the detector 233 can include correlators that operate on a radius and an angle (RO) of received signals. For example, the detector 233 can include a correlator that transforms a received complex signal (IQ signal) to the radius and angle (RO), and uses the radius and the angle for correlation with the reference signal. It is noted these detectors and correlators are provided as examples for the detector 233, but the embodiments of this disclosure are not limited to these examples.

According to some examples, the detector 233 and/or the digital muting mask 235 can also include one or more sliders. The one or more sliders are used to slide through the reference signal to compare it to the received beginning or part of the beginning of the preamble. By sliding through the reference signal and comparing it with the received beginning or part of the beginning of the preamble, the detector 233 can determine whether the received beginning or part of the beginning of the preamble matches part of the reference signal.

Figure 3:
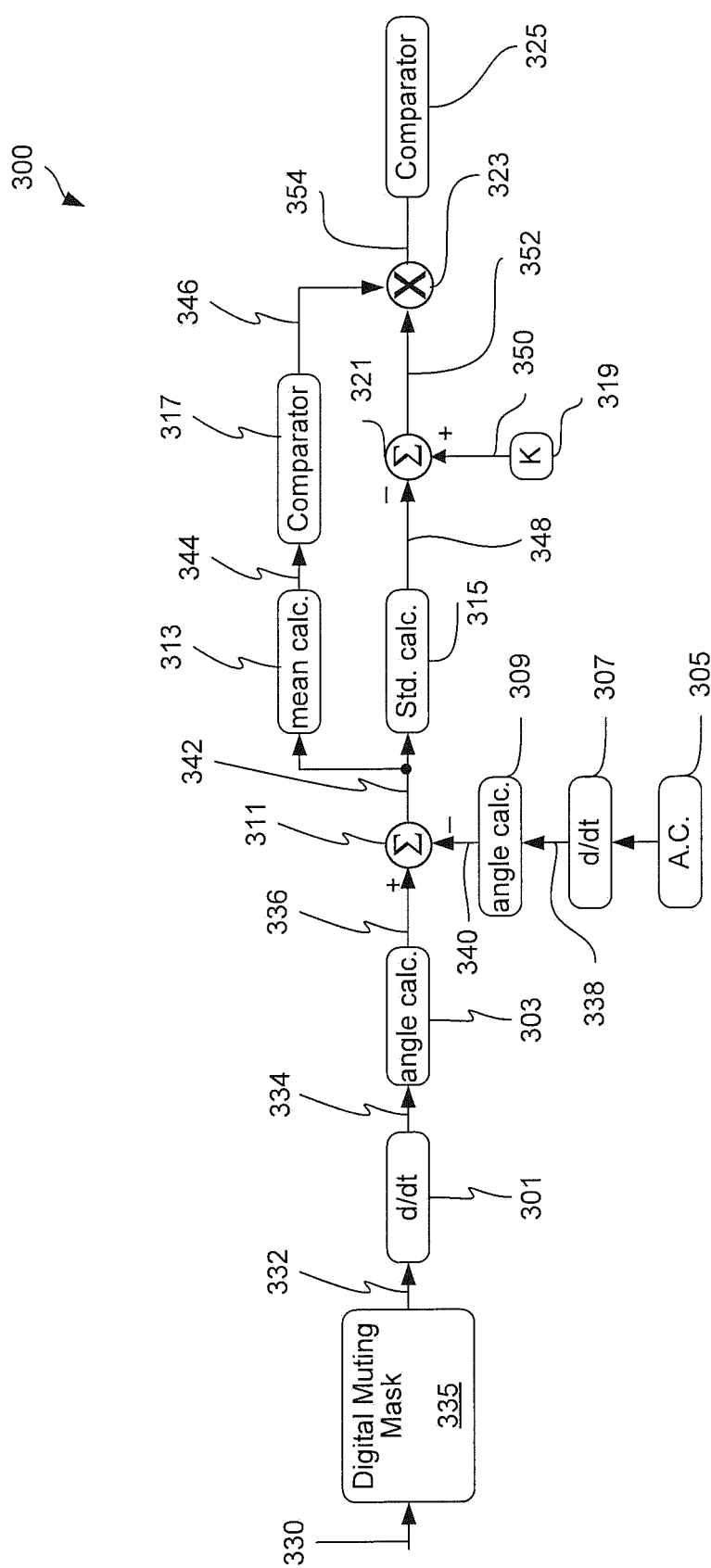
FIG. 3 is a functional block diagram depicting an example system implementing a detector, according to some embodiments.

FIG. 3 is a functional block diagram depicting an example system implementing a detector, according to some embodiments of the disclosure. The detector 300 of FIG. 3 can be implemented as or within one or more detectors 233 of FIG. 2. The detector 300 of FIG. 3 is one exemplary implementation of the detector 233. Detector 233 of FIG. 2 can be implemented using other components. According to some examples, detector 300 can be a scan early detector.

According to some examples, the detector 300 includes a digital muting mask 335. The digital muting mask 335 can be similar to the digital muting mask 235 (and 253) discussed earlier. In some examples, the digital muting mask 335 can be part of the detector 300. Additionally or alternatively, the digital muting mask 335 can be outside of the detector 300. The digital muting mask 335 can mask a received signal having a frequency different than a selected frequency of the digital muting mask.

As illustrated in FIG. 3, a signal 330 is input to the digital muting mask 335. The input signal 330 can be the digital signal 220 of FIG. 2. The output 332 of the digital muting mask 335 is input to a differentiator circuit 301. The differentiator circuit 301 is configured to generate a derivative of the signal 332. The differentiator circuit 301 may be implemented using, for example, an active differentiator circuit, a passive differentiator circuit, or other differentiator circuit. Signal 334, which is output of the differentiator circuit 301, is input to angle calculator circuit 303. According to some examples, the angle calculator circuit 303 is configured to determine an angle of the signal 334 and output signal 336. For example, the angle calculator circuit 303 can determine the angle of the signal 334 by taking an arctangent of the signal 334.

Similar operations are performed on a reference signal 305 (e.g., an access code.) According to some embodiments, the detector 300 is configured to determine whether the input signal 330 matches fully and/or partially the reference signal 305. As depicted in FIG. 3, reference signal 305 is input to the differentiator circuit 307. Signal 338, which is output of the differentiator circuit 307, is input to the angle calculator circuit 309. According to some examples, the angle calculator circuit 309 is configured to determine an angle of the signal 338 and output signal 340. For example, the angle calculator circuit 309 can determine the angle of the signal 338 by taking the arctangent of the signal 338.

Signals 336 and 340 are input to the adder circuit 311. In some examples, the adder circuit 311 is configured to determine the difference between signals 336 and 340. The difference signal 342 is input to the mean calculator circuit 313 and the standard deviation calculator circuit 315. The mean calculator circuit 313 is configured to receive the difference signal 342 and to determine the average of this signal. The signal 344, the output of the mean calculator circuit 315, is a frequency offset between the input signal 330 and the reference signal 305, according to some embodiments.

The signal 344 (e.g., the frequency offset between the input signal 330 and the reference signal 305) can be compared with a threshold at the comparator circuit 317. If the signal 344 is more that the threshold, the detector 300 determines that the input signal 330 and the reference signal 305 do not match. If during the operation of the comparator circuit 317 it is determined that the signal 344 is less than or equal to the threshold, then comparator circuit 317 can output the signal 344 as the signal 346 to the multiplier circuit 323. In some examples, the threshold can be around 100 kHz. However, the embodiments of this disclosure are not limited to this threshold and other values can be used.

Similarly, the difference signal 342 is input to the standard deviation calculator circuit 315, where the standard deviation of the difference signal 342 is calculated as signal 348. A constant value 319 is subtracted from the signal 348, by the adder circuit 321. In some examples, the value of the constant 319 can be around 1. However, the embodiments of this disclosure are not limited to this value and other constant values can be used.

Signal 352, which is the difference between the signal 348 and the constant value 319, is an input to the multiplier circuit 323. The signal 346 is also input to the multiplier circuit 323. Signal 354, the output of multiplier 323, is compared with a threshold at comparator 325. If the signal 354 is greater than the threshold, the detector 300 determines that the input signal 330 matches the reference signal 305. However, if the signal 354 is less than or equal to the threshold, the detector 300 determines that there is not a match between the input signal 330 and the reference signal 305.

Figure 4A:
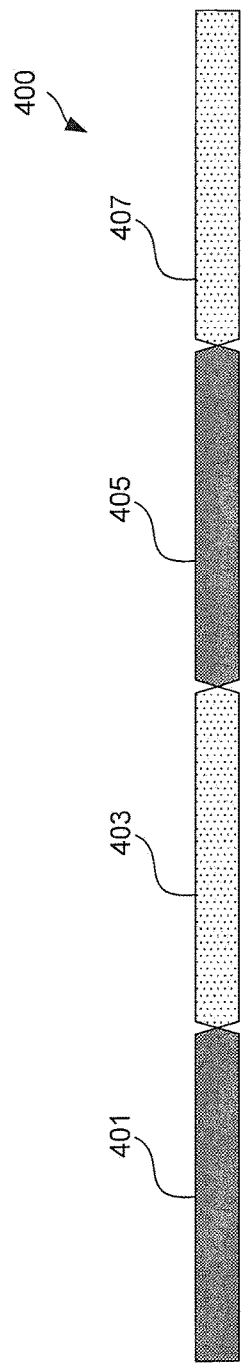
FIGS. 4A-4C depict example timing diagrams of a scan signal transmitted by a device, according to some embodiments.

FIG. 4A is a diagram depicting an example timing diagram 400 for scanning by a device such as device $104_1$ of FIG. 1A, according to some embodiments of the disclosure. The timing diagram 400 can include a first portion 401, a second portion 403, a third portion 405, a fourth portion 407, etc.

In some of the embodiments of this disclosure and referring back to FIG. 1A, the device $104_1$ may substantially simultaneously scan two or more frequencies using only one transceiver. For example, the device $104_1$ substantially simultaneously scans two or more frequencies based on the timing diagram 400. The device $104_1$ substantially simultaneously scans a channel associated with a frequency from a first set of frequencies and a channel associated with a frequency from a second set of frequencies. The portion 401 of the timing diagram 400 can be used for scanning a channel associated with a first frequency from a first set of frequencies associated with connection establishment according to the Bluetooth™ protocol. The portion 403 of the timing diagram 400 can be used for scanning a channel associated with a second frequency from a second set of frequencies associated with connection establishment according to the Bluetooth™ protocol. According to some examples, the first set of frequencies is different and separate from the second set of frequencies. In some other examples, the first and second sets of frequencies can overlap by any degree.

The portion 405 of the timing diagram 400 can be used for scanning a channel associated with a third frequency from the first set of frequencies associated with the Bluetooth™ connection. In some examples, the first and the third frequencies of the first set of frequencies in portions 401 and 405 can be the same. Alternatively, the first and the third frequencies of the first set of frequencies in portions 401 and 405 can be different frequencies within the first set of frequencies.

The portion 407 of the timing diagram 400 can be used for scanning a channel associated with a fourth frequency from the second set of frequencies associated with connection establishment according to the Bluetooth™ protocol. In some examples, the second and the fourth frequencies of the second set of frequencies in portions 403 and 407 can be the same. Alternatively, the second and the fourth frequencies of the second set of frequencies in portions 403 and 407 can be different frequencies within the second set of frequencies. In some examples, the portions 401, 403, 405, and 407 can be approximately 25 vs to 35 vs (e.g., approximately 32 vs) long. However, the embodiments of this disclosure are not limited to these examples.

In this example, the scanning of the first and second sets of frequencies are multiplexed in time. In other words, different time slots are used for portions 401, 403, 405, and 407. According to some embodiments, as illustrated in for example FIG. 4C, two or more of the portions 401, 403, 405, and 407 are within one page scan window (e.g., one page scan window 128A of FIG. 1B during the initial connection and pairing and/or one page scan window during further connections after the initial connection and pairing.) For example, the duration of the page scan window can be divided in two or more sections, each section including one of the portions 401, 403, 405, or 407.

Figure 4B:
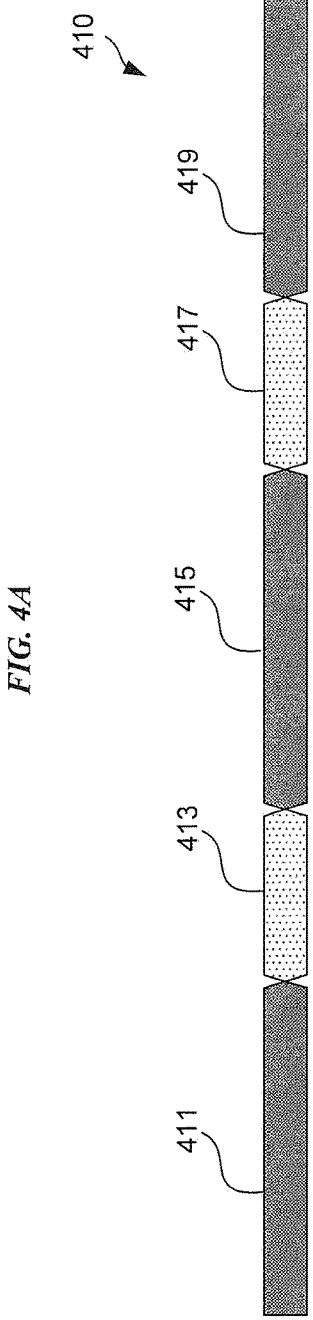
Figure 4C:
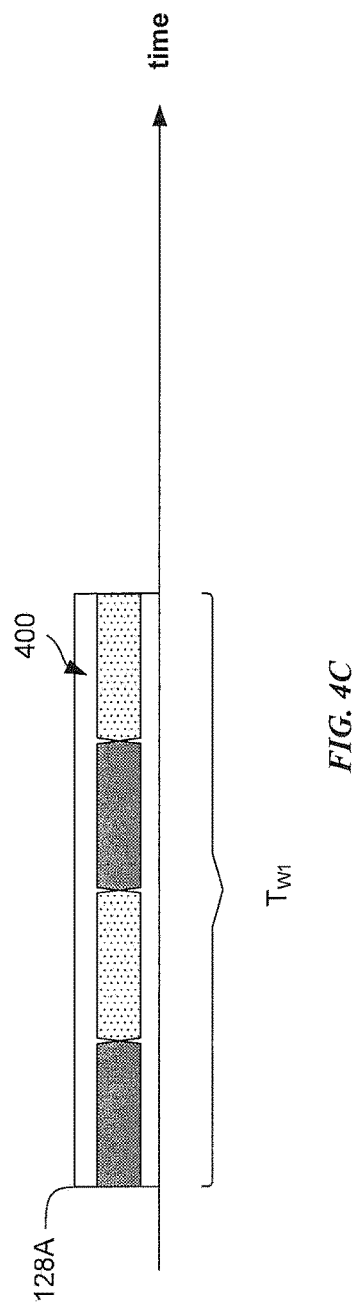

FIG. 4B is a diagram depicting an example timing diagram 410 for scanning by a device such as device $104_1$ of FIG. 1A, according to some embodiments of the disclosure. The timing diagram 410 can include a first portion 411, a second portion 413, a third portion 415, a fourth portion 417, a fifth portion 419, etc.

In some of the embodiments of this disclosure and referring back to FIG. 1A, the device $104_1$ may substantially simultaneously scan two or more frequencies using only one transceiver. For example, the device $104_1$ can substantially simultaneously scan two or more frequencies based on the timing diagram 410. The device $104_1$ substantially simultaneously scans a channel associated with a frequency from a first set of frequencies and a channel associated with a frequency from a second set of frequencies. The portion 411 of the timing diagram 410 can be used for scanning a channel associated with a first frequency from a first set of frequencies associated with connection establishment according to the Bluetooth™ Low Energy protocol. The portion 413 of the timing diagram 410 can be used for scanning a channel associated with a second frequency from a second set of frequencies associated with connection establishment according to the Bluetooth™ protocol. According to some examples, the first set of frequencies is different and separate from the second set of frequencies.

The portion 415 of the timing diagram 410 can be used for scantling a channel associated with a third frequency from the first set of frequencies associated with connection establishment according to the Bluetooth™ Low Energy protocol. In some examples, the first and the third frequencies of the first set of frequencies in portions 411 and 415 can be the same. Alternatively, the first and the third frequencies of the first set of frequencies in portions 411 and 415 can be different frequencies within the first set of frequencies. The portion 417 of the timing diagram 410 can be used for scanning a channel associated with a fourth frequency from the second set of frequencies associated with connection establishment according to the Bluetooth™ protocol. In some examples, the second and the fourth frequencies of the second set of frequencies in portions 413 and 417 can be the same. Alternatively, the second and the fourth frequencies of the second set of frequencies in portions 413 and 417 can be different frequencies within the second set of frequencies. In some examples, the portions 411, 415, and 419 can be approximately 25 μs to 35 μs (e.g., approximately 32 μs) long and portions 413 and 417 can be approximately 25 μs to 35 μs (e.g., approximately 32 μs) long. However, the embodiments of this disclosure are not limited to these examples.

In this example, the scanning of the first and second sets of frequencies are multiplexed in time. In other words, different time slots are used for portions 411, 413, 415, 417, and 419. According to some embodiments, two or more of the portions 411, 413, 415, 417, and 419 are within one page scan window (e.g., one page scan window 128A of FIG. 1B during the initial connection and pairing and/or one page scan window during further connections after the initial connection and pairing.) For example, the duration of the page scan window can be divided in two or more sections, each section including one of the portions 411, 413, 415, 417, and 419.

It is noted that the scan signal, sets of frequencies, and their combination are provided for example purposes only, and do not limit the embodiments of this disclosure. Based on the disclosure herein, a person of ordinary skill in art will understand that other sets and other combinations can exist.

According to some embodiments, the disclosed methods and systems allow a device to substantially simultaneously scan two or more frequencies using one receiver. For example, the controller 230, in operation with the transceiver 210 and the data acquisition circuitry 250, allows the devices, such as the device $104_1$, to substantially simultaneously scan two or more frequencies using one transceiver 210. Although the device $104_1$ is using one transceiver 201, from the point of view of the medium access control (MAC) layer of the device $104_1$, it appears that the device $104_1$ has two or more receivers.

These embodiments can reduce (improve) the time it takes for establishing the connection $106_8$ between the devices $104_1$ and $104_8$. For example, in some circumstances, the connection time can be reduced by a factor of 2-3. Depending on the implementation of the embodiments of this disclosure and, for example, the number of frequencies to be scanned substantially simultaneously, the improvement factor corresponding to the connection time can be higher. Further, compared to conventional methods and systems, by reducing the connection time, the periodicity of scanning by the device can be increased while keeping the power consumption of the device unchanged, according to some embodiments.

Additionally or alternatively, the embodiments of this disclosure can reduce (improve) the battery consumption (e.g., increase battery life) of the device $104_1$ for scanning and establishing the connection $106_8$ between the devices $104_1$ and $104_8$. For example, the battery consumption can be reduced by a factor of 2-3. Depending on the implementation of the embodiments of this disclosure and, for example, the number of frequencies to be scanned substantially simultaneously, the improvement factor corresponding to the battery consumption can be higher. Further, compared to conventional methods and systems, by reducing the connection time, the battery consumption can be reduced while keeping the periodicity of scanning by the device unchanged, according to some embodiments.

Figure 5A:
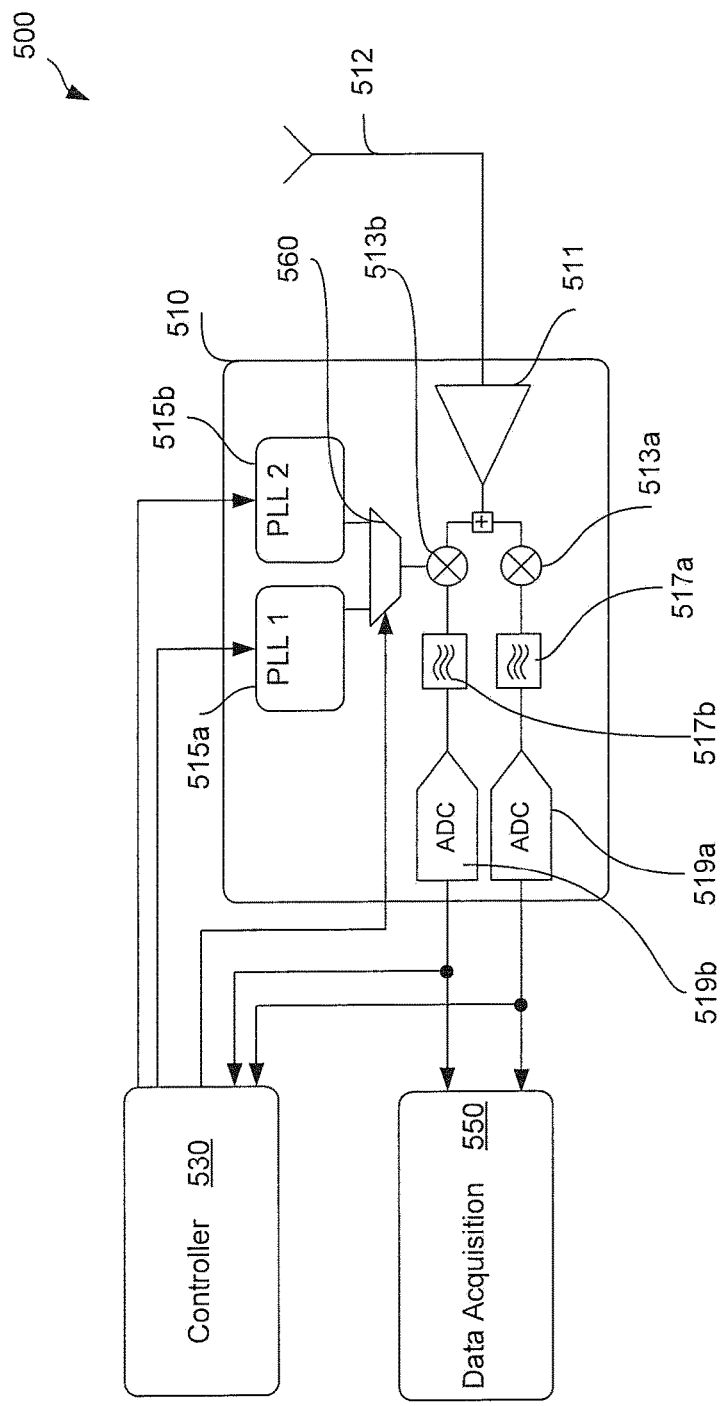
FIG. 5A is a functional block diagram depicting another example system implementing a scan method, according to some embodiments.

FIG. 5A is a functional block diagram depicting another example system implementing the scan method, according to some embodiments of the disclosure. System 500 of FIG. 5A can be implemented within one or more devices of FIG. 1A. System 500 may include a transceiver 510, a controller 530, and data acquisition circuitry 550. It is noted that the transceiver 510, the controller 530, and the data acquisition circuitry 550 are depicted as exemplary components of the system 500, and the system 500 can include other components.

As illustrated in the example of FIG. 5, the transceiver 510 may include an antenna 512, an amplifier 511, mixers 513a and 513b, phase-locked loops (PLL) 515a and 515b, filters 517a and 517b, converters 519a and 519b, and a multiplexer 560, according to some embodiments. In some examples, the amplifier 511 can include, but is not limited to, a low noise amplifier (LNA). The converters 519a and 519b can also include, but are not limited to, an analog to digital converter. According to some embodiments, the transceiver 510 may be configured to receive an input signal using, for example, the antenna 512 that is communicatively coupled to the amplifier 511. The received input signal may be amplified by the amplifier 511. The amplified signal may then be mixed, using the mixers 513a and/or 513b, with a signal from multiplexer 560.

The multiplexer 560 is controlled to output the output of PLL 515a or the output of PLL 515b. According to some embodiments, the multiplexer 560 can be controlled by the controller 530 such that the output signal of the multiplexer 560 includes a selected frequency and/or a selected frequency band. The amplified received input signal (e.g., an amplified radio frequency (RF) signal) and the output signal of the multiplexer 560 are input to the mixers 513a and/or 513b. According to some embodiments, the mixers 513a and/or 513b, using the output signal of the multiplexer 560, are configured to downconvert the amplified received input signal. Therefore, the output of the mixers 513a and/or 513b includes a baseband signal or an intermediate frequency (IF) signal, according to some embodiments.

The mixed signal outputs of mixers 513a and 513b can pass through the corresponding filters 517a and 517b. The filters 517a and 517b can include a low pass filter, a bandpass filter, and/or other filters. The filtered signal can be converted from analog to digital using the corresponding converters 519a and 519b to generate digital signals. The digital signals are then fed to the controller 530 and the data acquisition circuitry 550. According to the exemplary embodiments of FIG. 5A, the transceiver 510 may include an IQ transceiver, where I is the in-phase component of a waveform and Q is the quadrature component of the waveform. It is noted that the components of the transceiver 510 discussed above are exemplary circuits and/or modules, and transceiver 510 can include different, fewer, or additional circuits/modules.

According to some embodiments, the controller 530 can control the multiplexer 560 of the transceiver 510 to select between the PLL 515a and the PLL 515b. Additionally or alternatively, the controller 530 can configure the frequencies at which the PLLs 515a and 515b operate. For example, the controller 530 sets the PLL 515a to operate at a first frequency and sets the PLL 515b to operate a second frequency. Then, controller 530 controls the multiplexer 560 to switch between the first and second frequencies for the respective PLLs. In some embodiments, the controller 530 can be configured to change the frequencies at which the PLLs operate. For example, the controller 530 can set the PLL 515a to operate at the first frequency, but set the PLL 515b to operate a third frequency, different from the first frequency.

The operation of the controller 530 is similar to the controller 230 discussed above with respect to FIG. 2. The controller 530 can include one or more IQ correlators that would operate on the in-phase component and the quadrature component received from the transceiver 510. In addition to controlling the multiplexer 560 and/or the PLLs 515a and 515b, the controller 530 informs the data acquisition circuitry 550 that a detected beginning or part of the beginning of the preamble corresponds to a desired signal and instructs the data acquisition circuitry 550 to detect the preamble of the signal received from the transceiver 510. The operation of the data acquisition circuitry 550 is similar to the data acquisition 250 discussed above with respect to FIG. 2. The data acquisition circuitry 550 can include one or more IQ correlators that would operate on the in-phase component and/or the quadrature component received from transceiver 510.

Figure 5B:
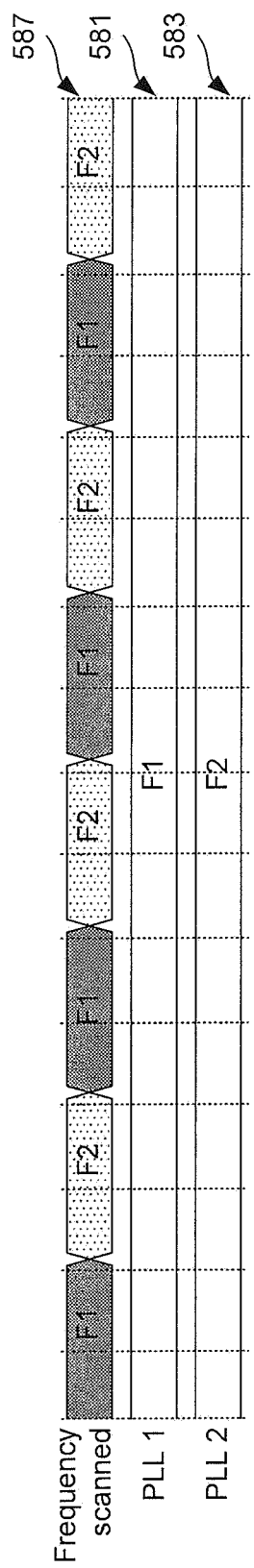
FIG. 5B is a diagram depicting an example timing of a scan signal transmitted by a transceiver of a device, according to some embodiments.

FIG. 5B is a diagram depicting an example timing 587 for scanning by the transceiver 510 of, for example, the device 104$_1$ of FIG. 1A, according to some embodiments of the disclosure. FIG. 5B also illustrates the timing of the frequencies generated by the PLLs. For example, timing diagram 581 illustrates the frequency generated by the PLL 515a. In this example, the PLL 515a generates a first frequency ($f_1$). Similarly, the timing diagram 583 illustrates the frequency generated by the PLL 515b. In this example, the PLL 515b generates a second frequency ($f_2$). As discussed above, controller 530 can control the PLLs and their frequencies.

FIG. 5B further illustrates timing diagram 587 of the frequencies scanned by transceiver 510. The timing diagram 587 illustrates that the frequencies scanned by transceiver 510 are toggled between the first frequency ($f_1$) and the second frequency ($f_2$). In this example, to achieve the timing diagram 587, the controller 530 may control the multiplexer 560 to select the PLLs as follows: PLL 515a, PLL 515b, PLL 515a, PLL 515b . . . . It is noted that these timing diagrams, sets of frequencies, and their combination are provided for example purposes only, and do not limit the embodiments of this disclosure. Based on the disclosure herein, a person of ordinary skill in art will understand that other sets and other combinations of frequencies can be utilized within the scope and spirit of the present disclosure.

In this example, the scanning of the first and second sets of frequencies are multiplexed in time. In other words, different time slots are used for portions of timing diagram 587. According to some embodiments, two or more of the portions of timing diagram 587 are within one page scan window (e.g., one page scan window 128A of FIG. 1B during the initial connection and pairing, and/or one page scan window during further connections after the initial connection and pairing.) For example, the duration of the page scan window can be divided in two or more sections, each section including one of the portions of timing diagram 587.

According to some examples, if a device such as device 104$_1$ includes two transceivers (e.g., in a multiple input multiple output (MIMO) device), the methods and apparatuses discussed above can be implemented in one or both of the transceivers. Accordingly, up to four frequencies can be scanned substantially simultaneously using the two transceivers. According to some examples, systems 200 and/or 500 can be used in each of the transceivers. For example, each of the two transceivers can use the system 200, where a first PLL would toggle between a first frequency and a second frequency, and a second PLL would toggle between a third frequency and a fourth frequency. In another example, each of the two transceivers can use the system 500, where a first multiplexer chooses between a first PLL at a first frequency and a second PLL at a second frequency, and a second multiplexer chooses between a third PLL at a third frequency and a fourth PLL at a fourth frequency.

Figure 6A:
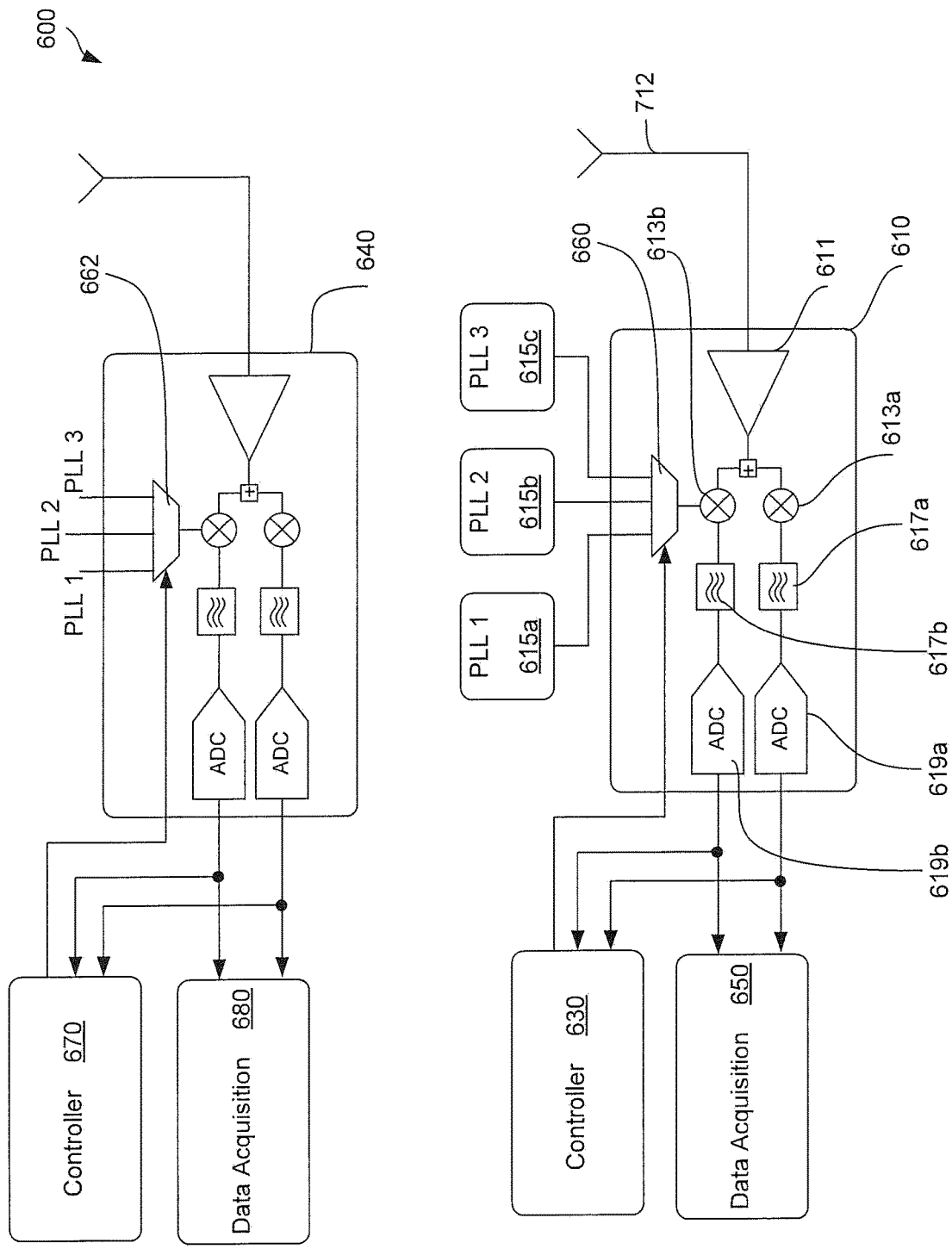
FIG. 6A is a functional block diagram depicting another example system implementing a scan method for scanning between four frequencies, according to some embodiments.

Alternatively, FIG. 6A is a functional block diagram depicting another example system implementing the scan method for scanning between four frequencies, according to some embodiments of the disclosure. System 600 of FIG. 6A can be implemented within one or more devices of FIG. 1A. System 600 may include two transceivers (e.g., transceivers 610 and 640), two controllers (e.g., controllers 630 and 670), and two data acquisition circuitries (e.g., data acquisition circuitries 650 and 680.) It is noted that the transceivers 610 and 640, the controllers 630 and 670, and the data acquisition circuitries 650 and 680 are depicted as exemplary components of system 600, and system 600 can include other components. Further, the transceivers 610 and 640, the controllers 630 and 670, and the data acquisition circuitries 650 and 680 are similar in operation and/or implementation respectively to the transceiver 510, the controller 530, and the data acquisition circuitry 550, discussed above with respect to FIG. 5. Accordingly, differences are discussed here for brevity.

One difference between the transceivers 610 and 640 of system 600 and the transceiver 510 of system 500 is that the transceivers 610 and 640 can include three PLLs and the multiplexers 660 and 662 select the outputs of one of the three PLLs. According to some examples, the three PLLs can be shared between the transceivers 610 and 640, as depicted in FIG. 6A. Additionally or alternatively, one or more of the PLLs can be dedicated to its respective transceiver. As discussed above with respect to FIG. 5, controllers 630 and 670 may control the multiplexers 660 and 662 and/or the frequencies of the PLLs.

It is noted that although controllers 630 and 670 are depicted as separate controllers in FIG. 6A, system 600 can include one controller configured to detect the beginning or part of the beginning of the preambles of signals received by the transceivers 610 and 640. The one controller can also control the PLLs and the multiplexers associated with the transceivers 610 and 640. Similarly, although data acquisition circuitries 650 and 680 are depicted as separate data acquisition circuitries, system 600 can include one data acquisition circuit configured to detect the preamble and/or payload of signals received by the transceivers 610 and 640.

Figure 6B:
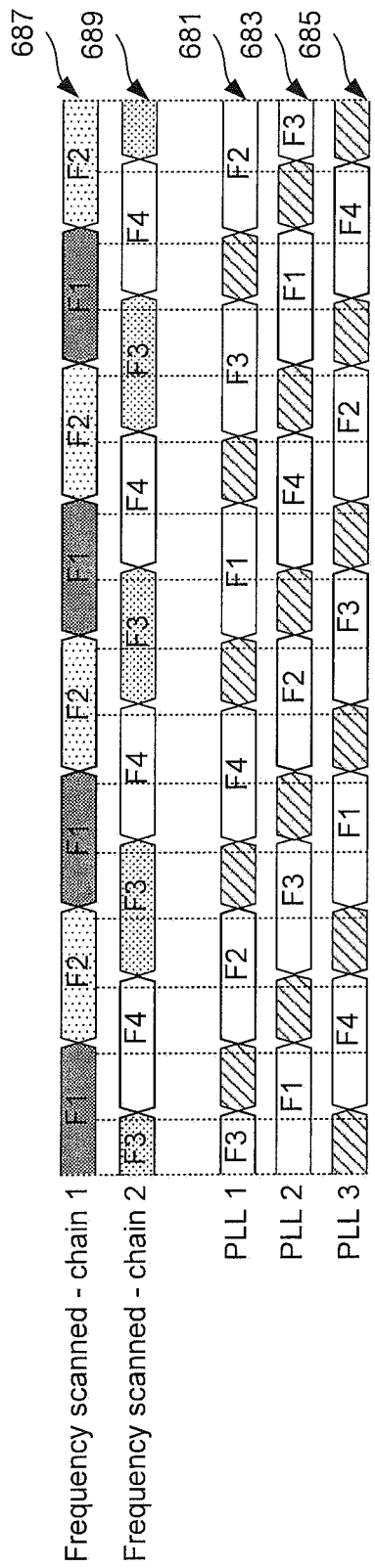
FIG. 6B depicts example timing diagrams of scan signals for two transceivers of a device, according to some embodiments.

FIG. 6B is a diagram depicting example timing diagrams 687 and 689 for scanning by two transceivers of, for example, the device $104_1$ of FIG. 1A, according to some embodiments of the disclosure.

FIG. 6B also illustrates the timing diagrams of the frequencies generated by the PLL. For example, the timing diagram 681 illustrates the frequencies generated by PLL 615a. In this example, PLL 615a generates a third frequency ($f_3$) for a period of time. Then PLL 615a transitions from the third frequency ($f_3$) to a second frequency ($f_2$). PLL 615a generates the second frequency ($f_2$) for a period of time. PLL 615a then transitions from the second frequency ($f_2$) to a fourth frequency ($f_4$). PLL 615a generates the fourth frequency ($f_4$) for a period of time. PLL 615a then transitions from the fourth frequency ($f_4$) to a first frequency ($f_1$). PLL 615a generates the first frequency ($f_1$) for a period of time. Then PLL 615a transitions to the third frequency ($f_3$). These changes in the frequency generated by the PLL 615a can repeat or vary in any pattern.

Similarly, timing diagram 683 illustrates the frequencies generated by PLL 615b of the transceiver 610 (and/or PLL 615b of the transceiver 710.) In this example, PLL 615b generates a first frequency ($f_1$) for a period of time. Then PLL 615b transitions from the first frequency ($f_1$) to a third frequency ($f_3$). PLL 615b generates the third frequency ($f_3$) for a period of time. PLL 615b then transitions from the third frequency ($f_3$) to a second frequency ($f_2$). PLL 615b generates the second frequency ($f_2$) for a period of time. PLL 615b then transitions from the second frequency ($f_2$) to a fourth frequency ($f_4$). PLL 615b generates the fourth frequency ($f_4$) for a period of time. Then PLL 615b transitions to the first frequency ($f_1$). These changes in the frequency generated by the PLL 615b can repeat or vary in any pattern.

Similarly, timing diagram 685 illustrates the frequencies generated by PLL 615c of the transceiver 610 (and/or PLL 615c of the transceiver 710.) In this example, PLL 615c generates a fourth frequency ($f_4$) for a period of time. Then PLL 615c transitions from the fourth frequency ($f_4$) to a first frequency ($f_1$). PLL 615c generates the first frequency ($f_1$) for a period of time. PLL 615c then transitions from the first frequency ($f_1$) to a third frequency ($f_3$). PLL 615c generates the third frequency ($f_3$) for a period of time. PLL 615c then transitions from the third frequency ($f_3$) to a second frequency ($f_2$). PLL 615c generates the second frequency ($f_2$) for a period of time. Then PLL 615c transitions to the fourth frequency ($f_4$). These changes in the frequency generated by the PLL 615c can repeat or vary in any pattern.

As discussed above, controllers 630 and/or 670 can control the PLLs and their frequencies.

FIG. 6B further illustrates timing diagram 687 of the frequencies scanned by transceiver 610 and timing diagram 689 of the frequencies scanned by transceiver 710. As shown by the timing diagram 687, the frequencies scanned by transceiver 610 are toggled between the first frequency ($f_1$) and the second frequency ($f_2$). Also, as shown by the timing diagram 689, the frequencies scanned by transceiver 710 are toggled between the third frequency ($f_3$) and the fourth frequency ($f_4$). In this example, to achieve the timing diagram 687, the controller 630 may control multiplexer 660 to select the PLLs as follows: PLL 615b, PLL 615a, PLL 615c, PLL 615b, PLL 615a, PLL 615c, etc. Also, to achieve the timing diagram 689, the controller 670 may control multiplexer 662 to select the PLLs as follows: PLL 615c, PLL 615b, PLL 615a, PLL 615c, PLL 615b, PLL 615a, etc.

It is noted that these timing diagrams, sets of frequencies, and their combination are provided as examples, and do not limit the embodiments of this disclosure. Based on the disclosure herein, a person of ordinary skill in art will understand that other sets of frequencies and other combinations can exist.

Figure 7:
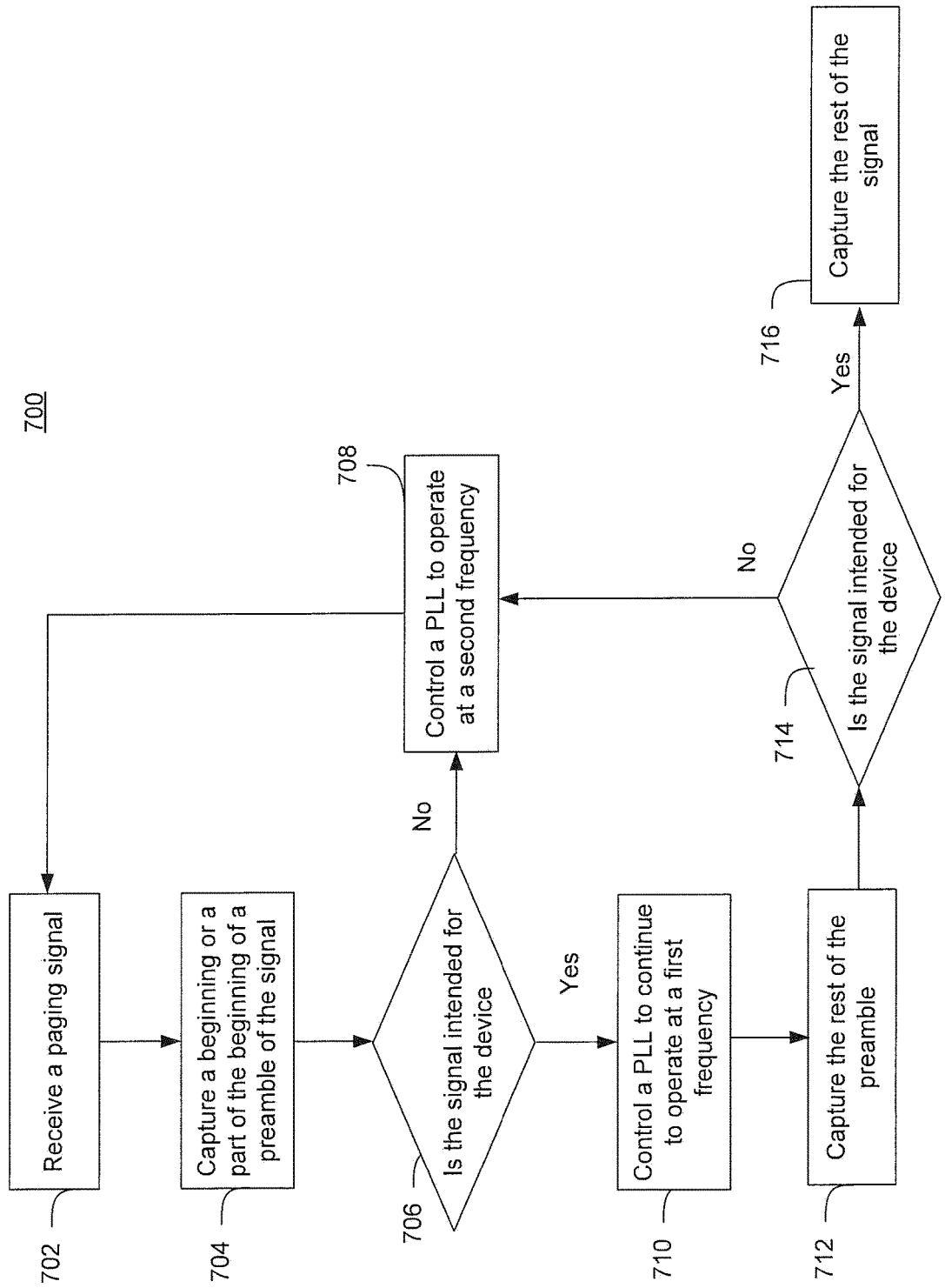
FIG. 7 is a flowchart depicting an example method for substantially simultaneously scanning two or more frequencies using one receiver, according to some embodiments.

FIG. 7 is a flowchart depicting an example method 700 for substantially simultaneously scanning two or more frequencies using one receiver, according to some embodiments. For convenience, FIG. 7 will be described with references to FIGS. 1 and 2, but method 700 is not limited to the specific embodiments depicted in those figures.

Method 700 begins at 702 when a first device, for example the device $104_1$, receives a signal from a second device, such as the device $104_8$. The signal that the device $104_1$ receives can include one or more pages from the device $104_8$. The device $104_1$ may amplify the received signal, mix the amplified signal with a signal from a PLL, filter the mixed signal, and covert the filtered signal to a digital signal for further processing. In this example, the PLL is configured to operate at a first frequency ($f_1$).

As discussed above with respect to FIG. 2, the first device can include the transceiver 210, the controller 230, and the data acquisition circuitry 250. Before receiving the signal from the second device, the controller 230 configures the transceiver 210 to operate at a first frequency. For example, the controller 230, which is communicatively coupled to the transceiver 210, using the state machine 231, controls the PLL 215 of the transceiver 210 to operate at the first frequency. After the transceiver 210 of the first device receives the signal from the second device, and optionally performs some further operation on the signal, the transceiver 210 sends the received signal to the controller 230 for further detection.

At 704, the device $104_1$ captures at least a portion (e.g., a beginning or a part of the beginning) of a preamble from the received signal. For example, digital muting mask 235 and detector 233 are configured to capture the beginning or the part of the beginning of the preamble. According to some examples, and as discussed with respect to FIG. 3, capturing the beginning or the part of the beginning of the preamble of the received signal can include digital mute masking of the received signal such that the received signal will be muted (e.g., the received signal is equaled to zero) if the frequency of the operation of the detector 233 is different from the frequency of the operation of the PLL 215. The capturing further can include determining a derivate of the received signal and an angle for the determined derivate of the signal. Additionally, the capturing can include determining a derivate of a reference signal (e.g., an access code) and an angle for the determined derivate of the reference signal. These operations are provided as examples for capturing the beginning or the part of the beginning of the preamble. However, the capturing can include other operations as understood by a person of ordinary skill in the art.

At 706, the device $104_1$ determines, based at least in part on the captured portion (e.g., the beginning or part of the beginning) of the preamble and before receiving and/or capturing the remainder of the preamble, whether the received signal is intended for the device $104_1$. For example, the controller 230, using the detector 233, is configured to determine whether the received digital signal is intended for the device $104_1$. In some embodiments, and as discussed with respect to FIG. 3, this detection can include comparing one or more calculated angles of the received signal and the reference signal, using a difference between the calculated angles to calculate the mean and/or the standard deviation of the difference, and comparing the calculated mean and/or standard deviation with one or more thresholds. These operations are provided as examples for determining whether the received signal is intended for the device $104_1$. However, the determining can include other operations as understood by a person of ordinary skill in the art. In some embodiments, the determination in 706 can have a high false-alarm rate. Therefore, method 700 can include a further determination in 714 to make sure that the received signal is intended for the device $104_1$, according to some embodiment. The determination in 714 can have a lower false-alarm rate.

If the received signal is not intended for the device $104_1$, the device $104_1$, using for example the controller 230 and the state machine 231, controls the PLL of the device $104_1$ at 708 to operate at a second frequency ($f_2$). For example, the controller 230 using the state machine 231 sends an instruction to PLL 215 of the transceiver 210 to operate at the second frequency. According to some examples, the state machine 231 periodically switches between the first frequency and the second frequency. Each time the state machine 231 switches from one frequency to another, an instruction is sent by the controller 230 to the PLL 215 to change the frequency of the operation of the PLL 215 of the transceiver 210.

In some embodiments, the periodically switching includes periodically switching between the first frequency of the first set of plurality of frequencies and the second frequency of the second set of plurality of frequencies during a page scan window of the first device. According to some examples, the state machine 231 is configured to switch between the first frequency and the second frequency with a frequency of, for example, approximately 2.5 KHz to approximately 200 KHz during a page scan window associated with the first device, according to some examples. For example, the PLL 215 can operate at the first frequency for approximately 25 µs to 35 µs (e.g., for approximately 32 µs) before switching to the second frequency (if the received signal at the first frequency is not intended for the device $104_1$). In this example, then the PLL 215 can operate at the second frequency for approximately 25 µs to 35 µs (e.g., for approximately 32 µs) before switching back to the first frequency (if the received signal at the second frequency is not intended for the device $104_1$). In another example, the PLL 215 can operate at the first frequency for approximately 25 µs to 35 µs (e.g., for approximately 32 µs) before switching to the second frequency (if the received signal is not intended for the device $104_1$). In this example, then the PLL 215 can operate at the second frequency for approximately 5 µs to 15 µs (e.g., for around 12 µs) before switching to the first frequency (if the received signal is not intended for the device $104_1$). In some examples, when at 706, the device $104_1$ determines that the received signal is intended for the device $104_1$, the PLL 215 operates at that specific determined frequency for approximately additional tens of microseconds (e.g., approximately 10 µs to 60 µs) before the device $104_1$, at 714, can determine whether the determination 706 was a false-alarm.

According to some embodiments, if the first device (e.g., the device $104_1$) determines that the received signal is not intended for it, the controller 230 of the first device does not interfere with the operation of the state machine 231. Therefore, the state machine 231 switches between the frequencies based on its pre-programmed time for switch. Additionally or alternatively, if the first device determines that the received signal is not intended for it, the controller 230 of the first device can instruct the state machine 231 to switch to the next frequency earlier in-time than when the state machine 231 would otherwise have switched.

Method 700 continues at 702 and operates using the second frequency ($f_2$).

However, if the received digital signal is intended for device $104_1$, the device $104_1$, using for example the controller 230 and the state machine 231, controls the PLL of the device $104_1$ at 710 to continue its operation at the first frequency ($f_1$). In other words, the state machine 231 ceases the switching between the first and second frequencies such that the received signal at the first frequency may be captured and decoded at the device $104_1$.

When the device $104_1$ determines that the received signal is intended for the device $104_1$, the device $104_1$ captures the rest of the preamble (e.g., the remainder portion of the preamble) from the received digital signal at 712. To capture the rest of the preamble from the received digital signal, the controller 230 of the device $104_1$ sends an instruction (e.g., signal 240 of FIG. 2) to the data acquisition circuitry 250 of the device $104_1$, according to some embodiments. This instruction can include a notification to the data acquisition circuitry 250 that the received signal at the device $104_1$ appears to be intended for the device $104_1$ and a request to the data acquisition circuitry 250 to perform correlation and acquisition of the received signal. This instruction may also include the captured frequency of the received signal (in this example, the first frequency ($f_1$)).

Data acquisition circuitry 250, using the correlator 251, is configured to capture the rest of the preamble of the received digital signal. The correlator 251 can include a detector similar to detector 300 of FIG. 3, according to some examples. However, the correlator 251 can include one or more other correlators as known by a person of ordinary skill in the art. According to some examples, the data acquisition circuitry 250, using the correlator 251, can capture the rest of the preamble of the received signal and compare the captured portions of the preamble with a reference signal to make sure that the received signal is intended for the first device. At 714, the data acquisition circuitry 250, using the correlator 251, compares the captured preamble with a reference signal to determine whether the received signal is intended for the first device. According to some embodiments, the reference signal used by the data acquisition circuitry 250 and the correlator 251 includes an identifier of the first device.

If the data acquisition circuitry 250 and the correlator 251 of the first device determine that the received signal is not intended for the first device, the data acquisition circuitry 250 can inform the controller 230 that the received signal is not intended for the first device. The data acquisition circuitry 250 can use signal 241 to communicate with the controller 230, according to some embodiments. In response, the controller 230 of the first device can instruct the state machine 231 to switch to the next frequency. Method 700 then continues at 702 and operates using the second frequency ($f_2$).

If the data acquisition circuitry 250 and the correlator 251 of the first device determine that the received signal is intended for the first device, method 700 continues at 716 where the data acquisition circuitry 250, using the correlator 251, remains at the first frequency ($f_1$) and can receive and capture the rest of the received signal (e.g., the payload associated with the received signal) and use the data and information within the preamble and the payload for establishing a connection with the second device.

Based on the data and information within the preamble and the payload of the received signal, the device $104_1$ may, for example, establish the connection with the device $104_8$.

Figure 8:
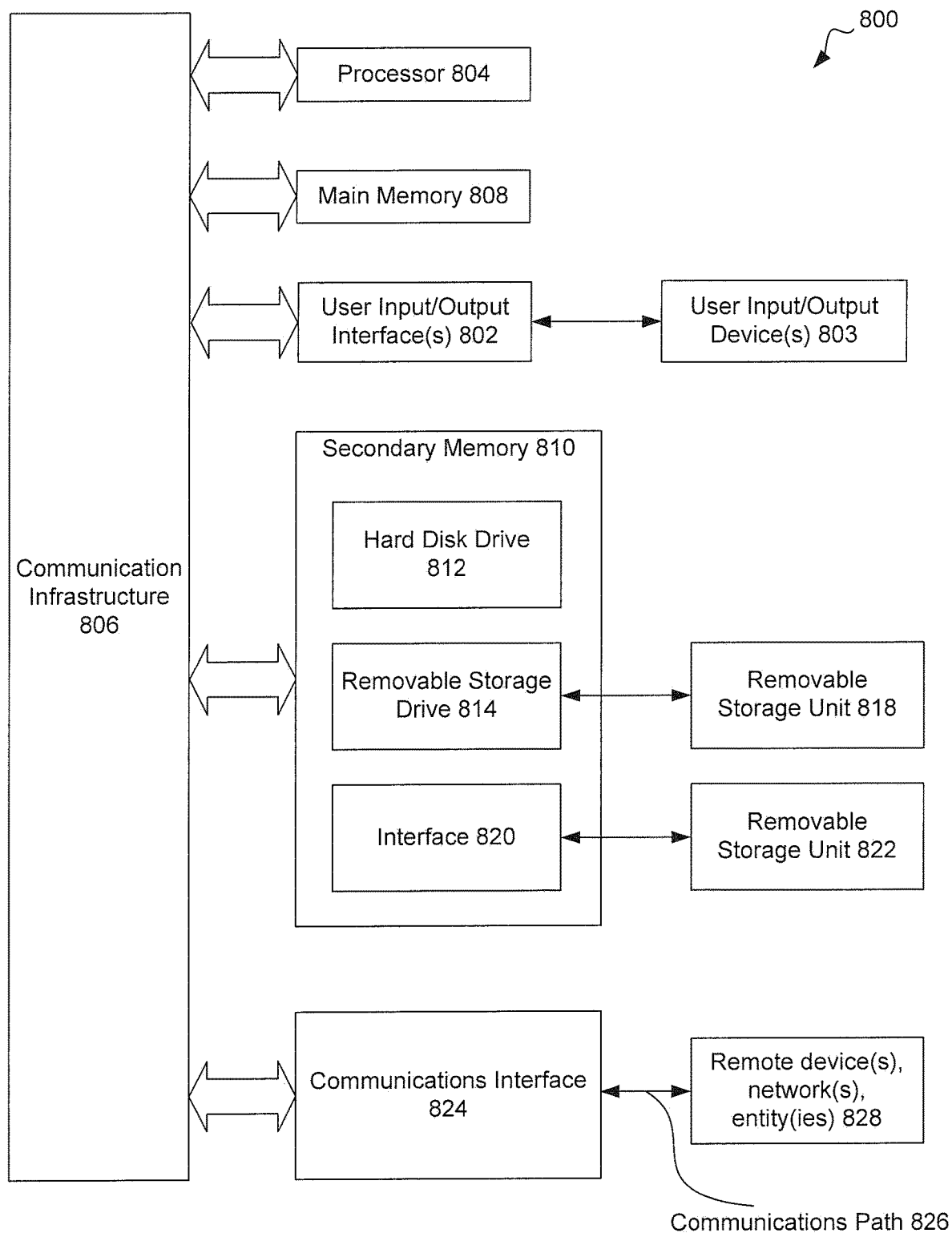
FIG. 8 is an example computer system useful for implementing some embodiments or portion(s) thereof.

Various embodiments can be implemented, for example, using one or more well-known computer systems, such as computer system 800 shown in FIG. 8. For instance, each of the components and/or operations described with reference to FIGS. 1-7 could be implemented using one or more computer systems 800 or portions thereof. Computer system 800 can be used, for example, to implement method 700 of FIG. 7. For example, computer system 700 can be used for substantially simultaneously scanning two or more frequencies using one receiver, according to some embodiments. The computer system 800 can be any computer capable of performing the functions described herein.

The computer system 800 includes one or more processors (also called central processing units, or CPUs), such as a processor 804. The processor 806 is connected to a communication infrastructure or bus 806.

The processor 806 may be, for example, a graphics processing unit (GPU). In some embodiments, the GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

The computer system 800 also includes user input/output/display device(s) 822, such as monitors, keyboards, pointing devices, etc., that communicate with communication infrastructure 804.

The computer system 800 also includes a main or primary memory 808, such as random access memory (RAM). The main memory 808 may include one or more levels of cache. The main memory 808 has stored therein control logic 828A (e.g., computer software) and/or data.

The computer system 800 may also include one or more secondary storage devices or memory 810. The secondary memory 810 may include, for example, a hard disk drive 812 and/or a removable storage device or drive 814. The removable storage drive 814 may be a floppy disk drive, a magnetic tape drive, a compact disk drive, an optical storage device, tape backup device, and/or any other storage device/drive.

The removable storage drive 814 may interact with a removable storage unit 816. The removable storage unit 818 includes a computer usable or readable storage device having stored therein control logic 828B (e.g., computer software) and/or data. The removable storage unit 818 may be a floppy disk, magnetic tape, compact disk, DVD, optical storage disk, and/any other computer data storage device. The removable storage drive 814 reads from and/or writes to the removable storage unit 816.

The computer system 800 may further include a communication or network interface 818. The communication interface 818 enables the computer system 800 to communicate and interact with any combination of remote devices, remote networks, remote entities, etc. (individually and collectively referenced by reference number 830). For example, communication interface 818 may allow the computer system 800 to communicate with remote devices 830 over a communications path 826, which may be wired and/or wireless, and which may include any combination of LANs, WANs, the Internet, etc. Control logic and/or data may be transmitted to and from computer system 800 via communication path 826.

In some embodiments, a tangible apparatus or article of manufacture including a tangible computer useable or readable medium having control logic (software) stored thereon is also referred to herein as a "computer program product" or "program storage device." This includes, but is not limited to, the computer system 800, the main memory 808, the secondary memory 810, and the removable storage unit 816, as well as tangible articles of manufacture embodying any combination of the foregoing. Such control logic, when executed by one or more data processing devices (such as the computer system 800), causes such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 8. In particular, embodiments may operate with software, hardware, and/or operating system implementations other than those described herein.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure so that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the present disclosure should not be limited by any of the above-described exemplary embodiments, but should be defined only in accordance with the following claims and their equivalents.

The claims in the instant application are different than those of any parent application or other related applications. The Applicant therefore rescinds any disclaimer of claim scope made in the parent application or any predecessor or related application in relation to the instant application. The Examiner is therefore advised that any such previous disclaimer and the cited references that it was made to avoid, may need to be revisited. Further, the Examiner is also reminded that any disclaimer made in the instant application should not be read into or against the parent or related application(s).

What is claimed is:

1. A method, comprising:
configuring a transceiver of a device to operate at a first frequency of a first set of frequencies;
receiving a signal from the transceiver;
capturing a portion of a preamble from the signal;
determining, based at least in part on the captured portion of the preamble and before capturing a remainder of the preamble, whether the received signal is intended for the device; and
in response to determining that the received signal is not intended for the device, configuring the transceiver to operate at a second frequency of a second set of frequencies.

2. The method of claim 1, further comprising:
in response to determining that the received signal is intended for the device,
permitting the transceiver of the device to continue operation at the first frequency of the first set of frequencies; and
capturing the remainder of the preamble and a payload from the received signal.

3. The method of claim 2, further comprising:
sending a signal to a data acquisition circuit, wherein the capturing the remainder of the preamble and the payload from the received signal is performed by the data acquisition circuit.

4. The method of claim 1, wherein configuring the transceiver of the device to operate at the first frequency of the first set of frequencies comprises:
controlling a phase locked loop (PLL) of the transceiver to operate at the first frequency of the first set of frequencies.

5. The method of claim 1, further comprising:
periodically switching between the first frequency of the first set of frequencies and the second frequency of the second set of frequencies during a page scan window.

6. The method of claim 1, wherein the first set of frequencies is associated with a connection establishment according to a Bluetooth™ protocol, a Bluetooth™ Low Energy protocol, or a Bluetooth™ Low Energy Long Range protocol.

7. The method of claim 6, wherein the second set of frequencies is associated with a connection establishment according to the Bluetooth™ protocol, the Bluetooth™ Low Energy protocol, or the Bluetooth™ Low Energy Long Range protocol.

8. The method of claim 1, wherein the captured portion of the preamble comprises at least a beginning of the preamble.

9. The method of claim 1, wherein configuring the transceiver of the device to operate at the first frequency of the first set of frequencies comprises:
controlling a multiplexer of the transceiver to select between an output of a first phase locked loop (PLL) operating at the first frequency of the first set of frequencies and an output of a second PLL operating at the second frequency of the second set of frequencies.

10. A method, comprising:
periodically switching between a first frequency of a first set of frequencies and a second frequency of a second set of frequencies at which a transceiver of a first device operates;
capturing a portion of a preamble from a signal received from a second device;
determining, based at least in part on the captured portion of the preamble and before capturing a remaining portion of the preamble, whether the received signal is intended for the first device; and
in response to determining that the received signal is not intended for the device, continuing the periodical switching between the first frequency of the first set of frequencies and the second frequency of the second set of frequencies.

11. The method of claim 10, further comprising:
in response to determining that the received signal is intended for the first device,
ceasing the periodical switching between the first and second set of frequencies; and
capturing the remaining portion of the preamble and a payload from the received signal; and
establishing a connection between the first device and the second device based on the captured remaining portion of the preamble and the payload from the received signal.

12. The method of claim 11, further comprising:
sending a signal to a data acquisition circuitry, wherein the capturing the remaining portion of the preamble and the payload from the received signal is performed by the data acquisition circuitry.

13. A system, comprising:
a transceiver comprising a phase lock loop (PLL); and
a controller communicatively coupled to the transceiver, the controller configured to:
configure the PLL of the transceiver to operate at a first frequency of a first set of frequencies;
capture a portion of a preamble from a signal received using the transceiver;
determine, based at least in part on the captured portion of the preamble and before capturing a remainder of the preamble, whether the received signal is intended for the system; and
in response to determining that the received signal is not intended for the system, configure the PLL to operate at a second frequency of a second set of frequencies.

14. The system of claim 13, wherein the controller is further configured to:
in response to determining that the received signal is intended for the system,
permit the PLL to continue operation at the first frequency of the first set of frequencies; and
capture the remainder of the preamble and a payload from the received signal.

15. The system of claim 13, further comprising:
a data acquisition circuitry communicatively coupled to the transceiver and the controller,
wherein the controller is further configured to, in response to determining that the received signal is intended for the system, send a signal to the data acquisition circuitry to capture the remainder of the preamble and a payload from the received signal.

16. The system of claim 13, wherein the controller is further configured to:
control the PLL to periodically switch between the first frequency of the first set of frequencies and the second frequency of the second set of frequencies during a page scan window.

17. The system of claim 13, wherein the controller comprises:
  a first detector configured to determine, based at least in part on the captured portion of the preamble, whether the received signal is intended for the system when the PLL operates at the first frequency of the first set of frequencies.

18. The system of claim 17, wherein the controller further comprises:
  a second detector configured to determine, based at least in part on the captured portion of the preamble, whether the received signal is intended for the system when the PLL operates at the second frequency of the second set of frequencies.

19. The system of claim 13, wherein the transceiver further comprises:
  a second PLL; and
  a multiplexer communicatively coupled to the PLL and the second PLL,
  wherein the controller is configured to control the multiplexer to select between an output of the PLL and an output of the second PLL.

20. The system of claim 13, wherein the captured portion of the preamble comprises at least a beginning of the preamble.

* * * * *